(12) United States Patent
Leong

(10) Patent No.: US 12,489,437 B2
(45) Date of Patent: Dec. 2, 2025

(54) POWER SEMICONDUCTOR DEVICE WITH VOLTAGE CLAMP CIRCUIT

(71) Applicant: Infineon Technologies Austria AG, Villach (AT)

(72) Inventor: Kennith Kin Leong, Villach (AT)

(73) Assignee: Infineon Technologies AG, Neubiberg (DE)

( * ) Notice: Subject to any disclaimer, the term of this patent is extended or adjusted under 35 U.S.C. 154(b) by 506 days.

(21) Appl. No.: 18/070,585

(22) Filed: Nov. 29, 2022

(65) Prior Publication Data

US 2024/0178830 A1 May 30, 2024

(51) Int. Cl.
*H03K 17/08* (2006.01)
*H10D 8/25* (2025.01)
(Continued)

(52) U.S. Cl.
CPC ............. *H03K 17/08* (2013.01); *H10D 8/25* (2025.01); *H10D 30/00* (2025.01); *H10D 89/611* (2025.01)

(58) Field of Classification Search
CPC .... H03K 17/08; H03K 17/6871; H01L 27/02; H01L 29/772; H01L 29/866
(Continued)

(56) References Cited

U.S. PATENT DOCUMENTS 7,164,589 B1   1/2007   Soldano et al.
7,595,680 B2   9/2009   Morita et al.
(Continued)

FOREIGN PATENT DOCUMENTS

CN   102640288 A   8/2012
CN   105871365 A   8/2016
(Continued)

OTHER PUBLICATIONS

Li, Xueqing, et al., "Medium Voltage Power Module Based on SiC JFETs", IEEE Applied Power Electronics Conference and Exposition (APEC), Mar. 26, 2017, pp. 3033-3037.
(Continued)

*Primary Examiner* — Danny Nguyen
(74) *Attorney, Agent, or Firm* — Murphy, Bilak & Homiller, PLLC

(57) ABSTRACT

A power semiconductor device includes: a main power switch having a drain, source, and gate; and a voltage clamp circuit in parallel with the main power switch and having a clamp voltage less than a breakdown voltage of the main power switch. The voltage clamp circuit includes: a pulldown switch having a normally-on gate electrically connected to the source of the main power switch; a plurality of series-connected diodes electrically connected between the drain of the main power switch and a drain of the pulldown switch; a voltage clamp device electrically connected between a source of the pulldown switch and the source of the main power switch; and a second power switch having a normally-off gate electrically connected to the drain of the pulldown switch, a drain electrically connected to the drain of the main power switch, and a source electrically connected to the source of the pulldown switch.

18 Claims, 5 Drawing Sheets

(51) Int. Cl.
  *H10D 30/00* (2025.01)
  *H10D 89/60* (2025.01)
(58) Field of Classification Search
  CPC .... H01L 27/0255; H10D 8/25; H10D 89/611; H02H 3/20; H02H 9/04
  USPC .......................................................... 361/56
  See application file for complete search history.

(56) References Cited

U.S. PATENT DOCUMENTS

| | | | |
|---|---|---|---|
| 7,768,758 | B2 | 8/2010 | Maier et al. |
| 7,825,467 | B2 | 11/2010 | Willmeroth et al. |
| 7,852,137 | B2 | 12/2010 | Machida et al. |
| 7,868,353 | B2 | 1/2011 | Machida et al. |
| 7,875,907 | B2 | 1/2011 | Honea et al. |
| 8,344,424 | B2 | 1/2013 | Suh et al. |
| 8,487,667 | B2 | 7/2013 | Iwamura |
| 8,604,512 | B2 | 12/2013 | Morita |
| 8,649,198 | B2 | 2/2014 | Kuzumaki et al. |
| 8,664,690 | B1 | 3/2014 | Chen et al. |
| 9,276,569 | B2 | 3/2016 | Ikeda |
| 9,443,845 | B1 | 9/2016 | Stafanov et al. |
| 10,224,924 | B1 | 3/2019 | Leong |
| 10,296,033 | B2 | 5/2019 | Adachi |
| 10,411,698 | B2 | 9/2019 | Sato et al. |
| 10,784,853 | B2 | 9/2020 | Leong |
| 10,811,525 | B2 | 10/2020 | Kinoshita et al. |
| 10,979,032 | B1 | 4/2021 | Leong et al. |
| 11,088,688 | B2 | 8/2021 | Pala |
| 12,051,979 | B2 | 7/2024 | Kanomata et al. |
| 12,057,828 | B2 | 8/2024 | Leong et al. |
| 12,081,207 | B2 | 9/2024 | Leong et al. |
| 2006/0145744 | A1 | 7/2006 | Diorio et al. |
| 2009/0167411 | A1 | 7/2009 | Machida et al. |
| 2009/0206363 | A1 | 8/2009 | Machida et al. |
| 2010/0155775 | A1 | 6/2010 | Gauthier et al. |
| 2011/0016440 | A1* | 1/2011 | Bergmann ........... H10D 89/601 716/106 |
| 2012/0026632 | A1* | 2/2012 | Acharya ............. H03K 17/081 361/56 |
| 2012/0139589 | A1* | 6/2012 | Machida ........... H02M 3/33507 327/109 |
| 2012/0217542 | A1 | 8/2012 | Morita |
| 2012/0262220 | A1 | 10/2012 | Springett |
| 2012/0287688 | A1 | 11/2012 | Fornage et al. |
| 2014/0085760 | A1* | 3/2014 | Lui .................... H03K 17/0822 361/91.5 |
| 2014/0145208 | A1 | 5/2014 | Rose et al. |
| 2014/0197448 | A1 | 7/2014 | Galy et al. |
| 2014/0203289 | A1 | 7/2014 | Liu et al. |
| 2014/0264431 | A1 | 9/2014 | Lal |
| 2014/0374766 | A1 | 12/2014 | Bahl et al. |
| 2015/0043116 | A1 | 2/2015 | Weyers et al. |
| 2015/0180469 | A1 | 6/2015 | Kim |
| 2015/0256163 | A1 | 9/2015 | Weis |
| 2016/0079233 | A1 | 3/2016 | Deboy et al. |
| 2016/0322485 | A1 | 11/2016 | Padmanabhan et al. |
| 2016/0344381 | A1 | 11/2016 | Cai |
| 2017/0047841 | A1 | 2/2017 | Zojer et al. |
| 2017/0062419 | A1 | 3/2017 | Rose et al. |
| 2017/0084600 | A1 | 3/2017 | Isobe |
| 2017/0103978 | A1 | 4/2017 | Prechtl et al. |
| 2017/0338809 | A1 | 11/2017 | Stefanov et al. |
| 2018/0219008 | A1 | 8/2018 | Prechtl et al. |
| 2019/0068181 | A1 | 2/2019 | Leong |
| 2019/0199289 | A1 | 6/2019 | Wei et al. |
| 2019/0252921 | A1 | 8/2019 | Lethellier et al. |
| 2019/0326280 | A1 | 10/2019 | Imam et al. |
| 2020/0098745 | A1 | 3/2020 | Roig-Guitart |
| 2020/0287536 | A1 | 9/2020 | Udrea et al. |
| 2020/0343167 | A1 | 10/2020 | Othman et al. |
| 2021/0210481 | A1 | 7/2021 | Guan et al. |
| 2022/0084916 | A1 | 3/2022 | Sugiyama et al. |
| 2022/0157981 | A1 | 5/2022 | Gupta et al. |
| 2022/0262960 | A1 | 8/2022 | Schiele et al. |
| 2022/0416784 | A1* | 12/2022 | Harrison ........... H03K 17/08142 |
| 2024/0072161 | A1 | 2/2024 | Sharma |

FOREIGN PATENT DOCUMENTS

| | | |
|---|---|---|
| EP | 3249815 A1 | 11/2017 |
| TW | 200541073 A | 12/2005 |
| WO | 2005002054 A1 | 1/2005 |
| WO | 2017159559 A1 | 9/2017 |
| WO | 2021206065 A1 | 10/2021 |

OTHER PUBLICATIONS

Oladele, Olanrewaju Kabir, et al., "Optimizing Switching Performance of Cascade-Light SiC JFET Bidirectional Switch for Matrix Converter", IEEE International Power Electronics and Application Conference and Exposition (KPEAC), 2018, pp. 1-6.

"Industry's first 1200V Half Bridge Module based on GaN technology", VisIC Techologies, https://www.psma.com/sites/default/files/uploads/tech-forums-semiconductor/presentations/is012-industrys-first-1200v-half-bridge-module-based-gan-technology.pdf, Nov. 2022, pp. 1-45.

Chen, Ren-Yi, et al., "Study and Implementation of a Current-Fed Full-Bridge Boost DC-DC Converter With Zero-Current Switching for High-Voltage Applications", IEEE Transactions on Industry Applications, vol. 44, No. 4, Jul./Aug. 2008, pp. 1218-1226.

Chowdhury, Dilder, "GaN FETs: Why cascode?", Sep. 30, 2020, pp. 1-6.

Friedli, Thomas, et al., Design and Performance of a 200-kHz All-SiC JFET Current DC-Link Back-to-Back Converter, IEEE Transactions on Industry Applications, vol. 45, No. 5, Sep./Oct. 2009, pp. 1868-1878.

Huber, Jonas Emanuel, "Automatic Reverse Blocking Bidirectional Switch", U.S. Appl. No. 17/542,660, filed Dec. 6, 2021.

Kolar, J.W., et al., "Novel Three-Phase AC-DC-AC Sparse Matrix Converter", IEEE, 2002, pp. 777-787.

Lindemann, A., "A New IGBT with Reverse Blocking Capability", Entwurf fuer EPE Conference, European Conference on Power Electronics and Applications, Graz, Austria, 2001, Posted to Internet on Sep. 11, 2014, 2001, pp. 1-7.

Siemaszko, Daniel, et al., "Active Self-Switching Methods for Emerging Monolithic Bidirectional Switches Applied to Diode-Less Converters", 2009 13th European Conference on Power Electronics and Applications, Sep. 8-10, 2009, pp. 1-9.

Soeiro, Thiago B., et al., "Three-Phase Modular Multilevel Current Source Rectifiers For Electric Vehicle Battery Charging Systems", IEEE, 2013, pp. 623-629.

Haehre, K., et al., "Switching Speed-Control of an Optimized Capacitor-Clamped Normally-On Silicon Carbide JFET Cascode", 15th International Power Electronics and Motion Control Conference, EPE-PEMC 2012 ECCE Europe, Novi Sad, Serbia, Sep. 4, 2012, pp. DSla. 11-1-DSla. 11-5.

* cited by examiner

=

POWER SEMICONDUCTOR DEVICE WITH VOLTAGE CLAMP CIRCUIT

BACKGROUND

Avalanche breakdown occurs in semiconductor devices when the electric field is strong enough such that mobile electrons or holes are accelerated to high enough speeds to knock other bound carriers free, creating more free charge carriers and thereby increasing the current and creating an avalanche during which large portions of a normally insulating crystal begin to conduct. The large voltage and possibly large current during avalanche result in excessive heat generation, and ultimately the device is destroyed absent mitigation. The voltage at which breakdown occurs is called the breakdown voltage.

Silicon (Si) and silicon carbide (SiC) technologies typically have avalanche handling capability, where the amount of energy that can be handled relates to the size of the device. Generally, Si power devices can handle more energy with the same RDSon (on-state resistance) class compared to SiC power devices due to larger die sizes. Lateral Gallium nitride (GaN) technology lacks avalanche handling capability. However, most lateral GaN technology has a relatively high breakdown voltage (e.g., 900V or higher) compared to Si technology. For a power device having a substantially lower breakdown voltage rating, e.g., 600V or 650V, the large margin mitigates against voltage overshoot issues. However, during an unclamped inductive switching event, avalanche breakdown is likely to occur which results in device destruction. This is especially important for bi-directional switch devices produced in GaN technology where in certain modes of operation, no current path is permitted and the device likely sees an unclamped inductive switching event. Without avalanche handling capability, the use of a bi-directional GaN switch device under both unclamped inductive switching and static switch conditions would be highly limited.

Hence, there is a need for GaN power devices with avalanche handling capability.

SUMMARY

According to an embodiment of a power semiconductor device, the power semiconductor device comprises: a main power switch having a drain, a source, and a gate; and a voltage clamp circuit in parallel with the main power switch and having a clamp voltage less than a breakdown voltage of the main power switch, wherein the voltage clamp circuit comprises: a pulldown switch having a normally-on gate electrically connected to the source of the main power switch; a plurality of series-connected diodes electrically connected between the drain of the main power switch and a drain of the pulldown switch; a voltage clamp device electrically connected between a source of the pulldown switch and the source of the main power switch; and a second power switch having a normally-off gate electrically connected to the drain of the pulldown switch, a drain electrically connected to the drain of the main power switch, and a source electrically connected to the source of the pulldown switch.

According to another embodiment of a power semiconductor device, the power semiconductor device comprises: a main bidirectional power switch having a first source/drain, a second source/drain, a first gate, and a second gate; and a voltage clamp circuit in parallel with the main bidirectional power switch and having a clamp voltage less than a breakdown voltage of the main bidirectional power switch, wherein the voltage clamp circuit comprises: a second bidirectional power switch having a first normally-off gate and a second normally-off gate; a first normally-on pulldown switch, a first plurality of series-connected diodes, and a first voltage clamp device collectively configured to turn on the first normally-off gate of the second bidirectional power switch in response to an over voltage condition during unclamped inductive switching of the power semiconductor device; and a second normally-on pulldown switch, a second plurality of series-connected diodes, and a second voltage clamp device collectively configured to turn on the second normally-off gate of the second bidirectional power switch in response to the over voltage condition.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

The embodiments described herein provide power semiconductor devices with a voltage clamp circuit in parallel with a main power switch and that provides avalanche handling capability. The voltage clamp circuit has a clamp voltage that is less than the breakdown voltage of the main power switch and therefore absorbs energy before breakdown of the main power switch occurs. The main power switch may be a unidirectional device in that the main power switch blocks voltage in only one direction but permits current flow in both directions. The main power switch instead may be a bidirectional device in that the main power switch blocks voltage in both directions and permits current flow in both directions. In either case, the voltage clamp circuit absorbs inductive energy during unclamped inductive switching of the main power switch. The voltage clamp circuit is ideal for GaN power switch devices that lack avalanche handling capability, but also may be used in other semiconductor technologies such as Si, SiC, etc.

The amount of energy absorbed by the voltage clamp circuit depends on the circuit design and effectively the device size. Theoretically, the voltage clamp circuit may be designed to handle any amount of energy with the main disadvantage being increased die (chip) size. The clamping voltage implemented by the voltage clamp circuit also may be designed to be any desired value, within reason, and thus is highly flexible. Furthermore, the voltage clamp circuit may operate unidirectionally or bidirectionally, depending on the type of main power switch used.

Described next, with reference to the figures, are exemplary embodiments of the voltage clamp circuit.

Figure 1:
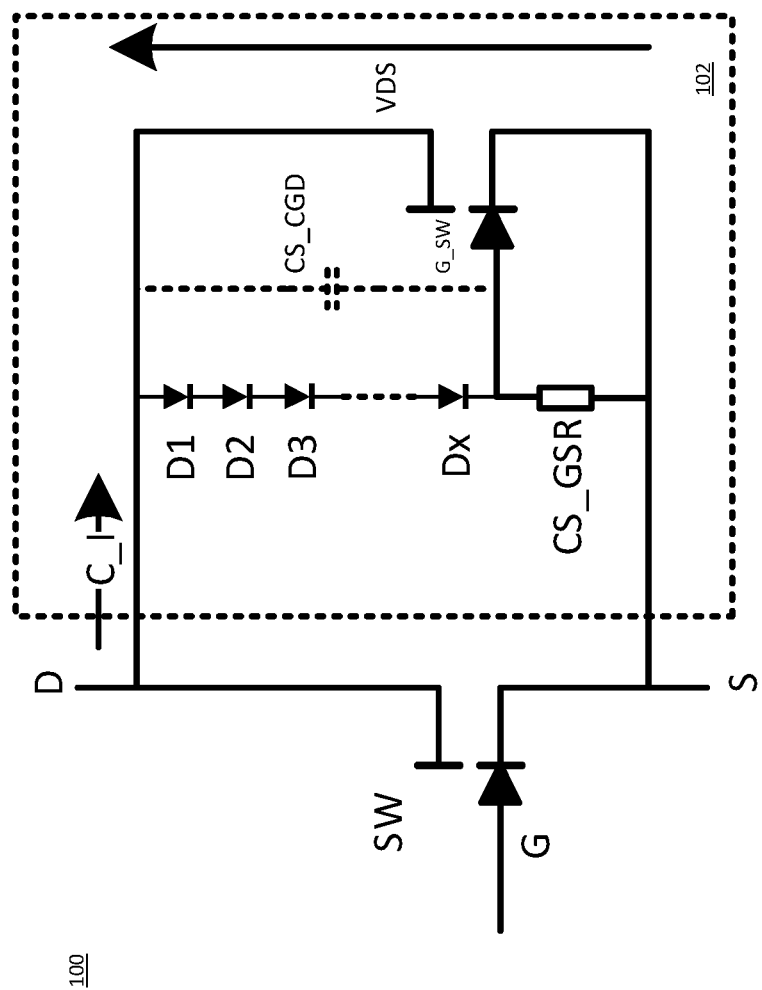
FIG. 1 illustrates a circuit schematic of an embodiment of a power semiconductor device that includes a unidirectional main power switch and a voltage clamp circuit in parallel with the main power switch.

FIG. 1 illustrates an embodiment of a power semiconductor device 100 that includes a main power switch SW and a voltage clamp circuit 102 in parallel with the main power switch SW. The main power switch SW is illustrated as a normally-off (i.e., enhancement mode) transistor but instead may be a normally-on (i.e., depletion mode) transistor. For a transistor with a normally-off gate, a current conduction channel is not present between the drain and source terminals D, S of the main power switch SW without a suitable voltage applied to the gate terminal G of the main power switch SW. For a transistor with a normally-on gate, a current conduction channel is present between the drain and source terminals D, S of the main power switch SW absent any voltage being applied to the gate terminal G of the main power switch SW.

The voltage clamp circuit 102 in parallel with the main power switch SW has a clamp voltage V_clamp less than the breakdown voltage $V_{(BR)DSS}$ of the main power switch SW and includes a high voltage switch CS_SW in parallel with the main power switch SW. The normally-off gate G_SW of the high voltage switch CS_SW is electrically connected to ground by a resistor CS_GSR. The resistor CS_GSR pulls down the normally-off gate G_SW of the high voltage switch CS_SW to ensure that the high voltage switch CS_SW should be off in most conditions.

The normally-off gate G_SW of the high voltage switch CS_SW also is electrically connected to the drain D_SW of the main power switch SW by a plurality of series-connected diodes D1 . . . Dx. The number (x) of diodes D1 . . . Dx in series determines the clamping voltage V_clamp implemented by the voltage clamp circuit 102. Accordingly, the clamping voltage V_clamp may be adjusted by changing the number of diodes D1 . . . Dx in series. In one embodiment, the diodes D1 . . . Dx included in the voltage clamp circuit 102 are series-connected ESD (electrostatic discharge) protection diodes.

The high voltage switch CS_SW of the voltage clamp circuit 102 should remain off until the drain-to-source voltage VDS of the main power switch SW rises above the clamp voltage V_clamp determined by the number (x) of series-connected diodes D1 . . . Dn. When V_clamp>VDS, a current is injected into the normally-off gate G_SW of the high voltage switch CS_SW of the voltage clamp circuit 102 and the high voltage switch CS_SW turns on and channels part (C_I) of the main current. This condition lasts until VDS drops below V_clamp or the high voltage switch CS_SW fails. Accordingly, the voltage clamp circuit 102 absorbs some energy during over voltage conditions and provides some buffer before destructive avalanche breakdown occurs.

Figure 2B:
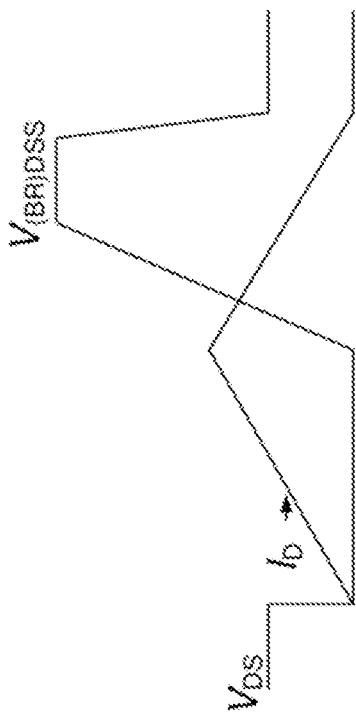
FIGS. 2A and 2B illustrate a test circuit (FIG. 2A) and waveform (FIG. 2B) for simulating an unclamped inductive load switching condition.
Figure 2A:
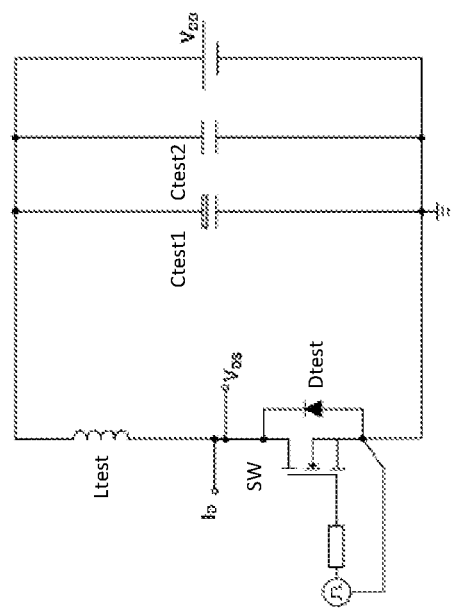

FIG. 2A illustrates an clamped inductive load test circuit for testing the main power switch SW during unclamped inductive switching. The clamped inductive load test circuit is implemented as a DC chopper circuit that includes a DC source VDD, capacitors Ctest1, Ctest2, an inductor Ltest, and a diode Dtest. When the main power switch SW is turned off, energy remaining in the inductor Ltest free wheels through the diode Dtest. The diode Dtest limits the drain-to-source voltage VDS across the main power switch SW. In the unclamped case, the diode Dtest is omitted and the drain current $I_D$ and drain-to-source voltage VDS of the main power switch SW behave as shown in FIG. 2B during switch off of the main power switch, with VDS reaching the breakdown voltage $V_{(BR)DSS}$ of the main power switch SW. The voltage clamp circuit 102 in FIG. 1 should prevent VDS from reaching the breakdown voltage $V_{(BR)DSS}$ of the main power switch SW if the energy stored in Ltest is not too high.

In an inductive, current driven case, the voltage clamp circuit 102 in FIG. 1 may not operate as intended. Turn on of the high voltage switch CS_SW of the voltage clamp circuit 102 during unclamped inductive switching is dominated by the gate-to-drain capacitance (CS_CGD) of the high voltage switch CS_SW such that the series-connected diodes D1 . . . Dx have no influence over the switching. The voltage clamp circuit 102 in FIG. 1 allows some current to flow even under clamped conditions, resulting in losses whenever turn off occurs. The series-connected diodes D1 . . . Dx could be made significantly large to reduce the CS_CGD influence, but doing so would require a large amount of die area and increase the delay before the large diodes are activated, resulting in poor response.

Figure 3:
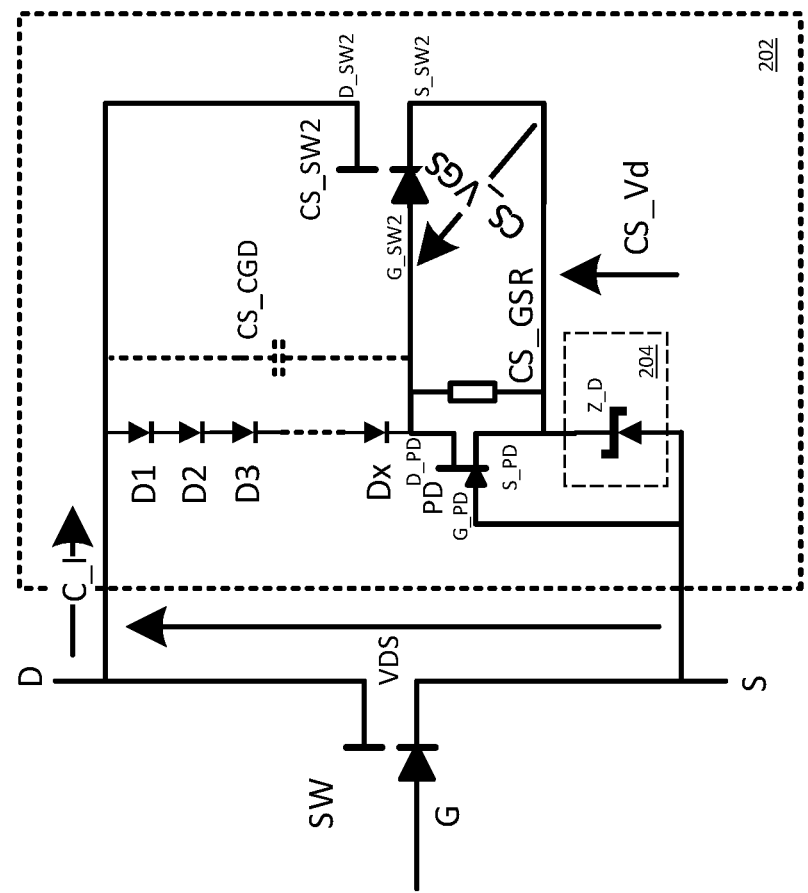
FIG. 3 illustrates a circuit schematic of another embodiment of a power semiconductor device that includes a unidirectional main power switch and a voltage clamp circuit in parallel with the main power switch.

FIG. 3 illustrates an embodiment of a power semiconductor device 200 that includes the unidirectional main power switch SW and an improved voltage clamp circuit 202 in parallel with the main power switch SW. The improved voltage clamp circuit 202 has a clamp voltage V_clamp less than the breakdown voltage $V_{(BR)DSS}$ of the main power switch SW. As explained above, the clamp voltage V_clamp depends on the number of diodes D1 . . . Dx connected in series. For example, in the case of ESD protection diodes with a threshold or cut-in voltage of 3.3V, 80 to 140 diodes may be connected in series to yield a clamp voltage V_clamp in a range of 600V to 900V. More of less diodes may be used to set the clamp voltage V_clamp, and the number of series-connected diodes D1 . . . Dx depends on various factors including the diode technology, the breakdown voltage of the main power switch SW, etc.

In addition to the series-connected diodes D1 . . . Dx, the improved voltage clamp circuit 202 further includes a pulldown switch PD, a voltage clamp device 204, and a second power switch CS_SW2. Also, the resistor CS_GSR of the improved voltage clamp circuit 202 is electrically connected between the source S_PD and the drain D_PD of the pulldown switch PD.

The pulldown switch PD of the improved voltage clamp circuit 202 has a normally-on gate G_PD. Accordingly, the pulldown switch PD is a normally-on device. The normally-on gate G_PD of the pulldown switch PD is electrically connected to the source S of the main power switch SW. The series-connected diodes D1 . . . Dx are electrically connected between the drain D of the main power switch SW and the drain D_PD of the pulldown switch PD. The drain D_PD of the pulldown switch PD is electrically connected to the normally-off gate of the second power switch CS_SW2.

The voltage clamp device 204 of the improved voltage clamp circuit 202 is electrically connected between the source S_PD of the pulldown switch PD and the source S of the main power switch SW. The second power switch CS_SW2 of the improved voltage clamp circuit 202 has a normally-off gate G_SW2 electrically connected to the drain D_PD of the pulldown switch PD, a drain D_SW2 electrically connected to the drain D of the main power switch SW, and a source S_SW2 electrically connected to the source S_PD of the pulldown switch PD.

Different than in FIG. 1, the pulldown switch PD with the normally-on gate G_PD ensures that second power switch CS_SW2 does not spuriously turn on even under clamped inductive switching. The source S_SW2 of the second power switch CS_SW is decoupled from the source S of the main switch SW by the voltage clamp device 204. Furthermore, the normally-on gate G_PD of the pulldown switch PD is connected to the source S of the main power switch SW which ensures that the voltage across the voltage clamp device 204 is applied to the source S_PD and gate G_PD of the normally-on pulldown switch PD. As a result, the voltage CS_Vd across the voltage clamp device 204 must be high enough to turn off the normally-on pulldown switch PD before the second power switch CS_SW can be turned on to handle any inductive switching. The normally-on pulldown switch PD, the series-connected diodes D1 . . . Dx, and the voltage clamp device 204 collectively turn on the normally-off gate G_SW2 of the second power switch CS_SW2 in response to an over voltage condition.

In FIG. 3, the voltage clamp device 204 is implemented as a Zener diode Z_D. The cathode of the Zener diode Z_D is electrically connected to the source S_PD of the pulldown switch PD. The anode of the Zener diode Z_D is electrically connected to the source S of the main power switch SW.

Figure 4:
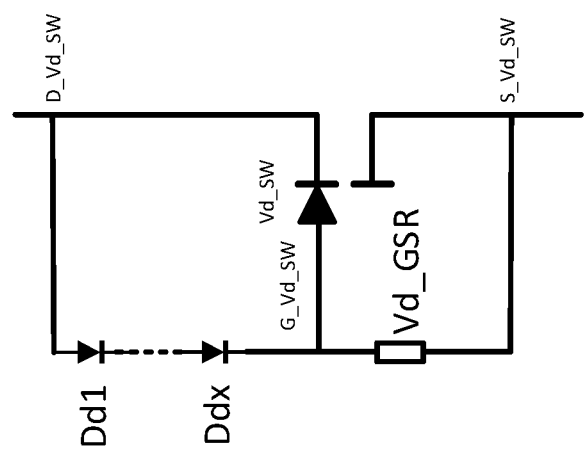
FIG. 4 illustrates a circuit schematic of an embodiment of a voltage clamp device which approximates the behavior of a Zener diode.
Figure 4:
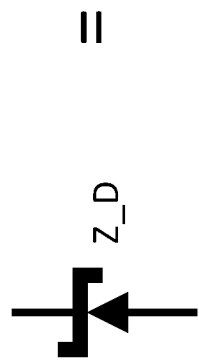

FIG. 4 illustrates another embodiment of the voltage clamp device 204 where the behavior of the Zener diode Z_D shown in FIG. 3 is approximated using a transistor Vd_SW, a plurality of diodes Dd1 . . . DdN, and a resistor Vd_GSR. The diodes Dd1 . . . DdN are electrically connected between the drain D_Vd_SW of the transistor Vd_SW and the gate G_Vd_SW of the transistor Vd_SW. The resistor Vd_GSR is electrically connected between the source S_Vd_SW of the transistor Vd_SW and the gate G_Vd_SW of the transistor Vd_SW. The drain D_Vd_SW of the transistor Vd_SW is electrically connected to the source S_PD of the normally-on pulldown switch PD. The source S_Vd_SW of the transistor Vd_SW is electrically connected to the source S of the main power switch SW.

A voltage sweep simulation for the power semiconductor device 200 of FIG. 3 with the improved voltage clamp circuit 202 shows that the gate-to-source voltage CS_VGS of the second power switch CS_SW drops to zero once the applied sweep voltage is not high enough to keep the pulldown switch PD off. The clamped switching condition does not induce any current shoot through and therefore the improved voltage clamp circuit 202 avoids any unnecessary switching losses. Furthermore, the clamp voltage V_clamp may be modified by changing the number of diodes D1 . . . Dx connected in series between the drain D of the main power switch SW and the drain D_PD of the pulldown switch PD. As explained above, the improved voltage clamp circuit 202 can channel any amount of energy within reason, with the main drawback being increased die (chip) size.

In one embodiment, the main power switch SW is a first normally-off GaN transistor, the pulldown switch PD is a normally-on GaN transistor, and the second power switch CS_SW2 is a second normally-off GaN transistor. The first normally-off GaN transistor, the normally-on GaN transistor and the second normally-off GaN transistor may be monolithically integrated in the same GaN die. The first normally-off GaN transistor and the second normally-off GaN transistor may have the same breakdown voltage, and the second normally-off GaN transistor may have a smaller (die/chip) area than the first normally-off GaN transistor. As explained above, the improved voltage clamp circuit 202 is ideal for GaN power switch devices that lack avalanche handling capability, but may also be used in other semiconductor technologies such as Si, SiC, etc.

Figure 5:
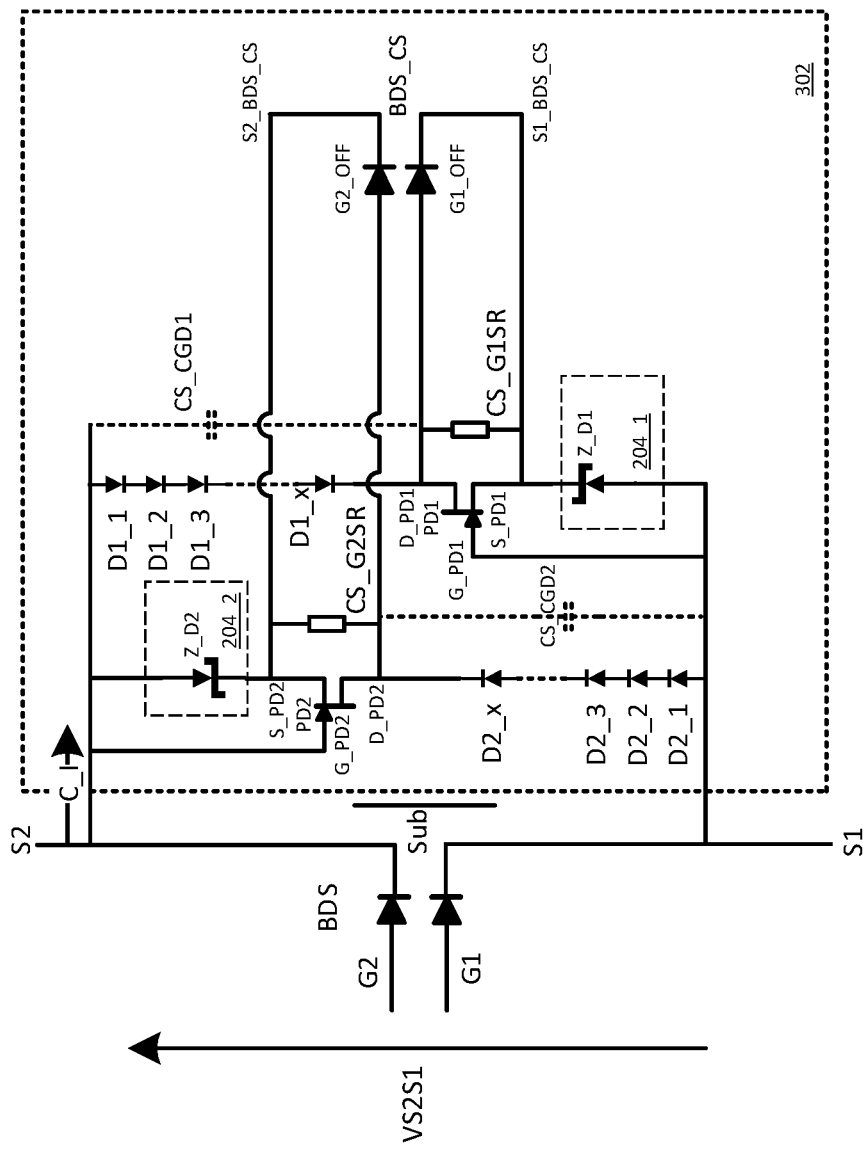
FIG. 5 illustrates a circuit schematic of an embodiment of a power semiconductor device that includes a bidirectional main power switch and a voltage clamp circuit in parallel with the main power switch.

FIG. 5 illustrates an embodiment of a power semiconductor device 300 that includes a main power switch BDS and an improved voltage clamp circuit 302 in parallel with the main power switch SW. According to this embodiment, the main power switch BDS is a bidirectional switch. That is, the main power switch BDS blocks voltage in both directions (S1→S2 and S2→S1) and permits current flow in both directions.

The main bidirectional power switch BDS has a first source/drain S1, a second source/drain S2, a first gate G1, and a second gate G2. The improved voltage clamp circuit 302 has a clamp voltage V_clamp less than the breakdown voltage $V_{(BR)DSS}$ of the main bidirectional power switch BDS.

According to the embodiment illustrated in FIG. 5, the improved voltage clamp circuit 302 includes a second bidirectional power switch BDS_CS having a first normally-off gate G1_OFF and a second normally-off gate G2_OFF. The second bidirectional power switch BDS_CS may have the same breakdown voltage as the main bidirectional power switch BDS but a smaller (die/chip) area. The second bidirectional power switch BDS_CS is used to handle any over voltage condition due to unclamped inductive switching.

The improved voltage clamp circuit 302 in FIG. 5 also includes a first normally-on pulldown switch PD1, a first plurality of series-connected diodes D1_1 . . . D1_x, and a first voltage clamp device 204_1. A first resistor CS_G1SR is electrically connected between the source S_PD1 and the drain D_PD1 of the first normally-on pulldown switch PD1. The first normally-on pulldown switch PD1, the first plurality of series-connected diodes D1_1 . . . D1_x, and the first voltage clamp device 204_1 are collectively configured to turn on the first normally-off gate G1_OFF of the second bidirectional power switch BDS_CS in response to an over voltage condition during unclamped inductive switching of the power semiconductor device 300 between S2 and S1.

Further according to the embodiment illustrated in FIG. 5, the improved voltage clamp circuit 302 also includes a second normally-on pulldown switch PD2, a second plurality of series-connected diodes D2_1 . . . D2_x, and a second voltage clamp device 204_2. A second resistor CS_G2SR is electrically connected between the source S_PD2 and the drain D_PD2 of the second normally-on pulldown switch PD2. The second normally-on pulldown switch PD2, the second plurality of series-connected diodes D2_1 . . . D2_x, and the second voltage clamp device 204_2 collectively turn on the second normally-off gate G2_OFF of the second bidirectional power switch BDS_CS in response to an over voltage condition between S1 and S2.

The improved voltage clamp circuit 302 in FIG. 5 is bidirectional since in the reverse direction, the first voltage clamp device 204_1 conducts through the first normally-on pulldown switch PD1 and turns on the first normally-off gate G1 of the second bidirectional power switch BDS_CS as a gated diode. In the forward direction, the second voltage clamp device 204_2 conducts through the second normally-on pulldown switch PD2 and turns on the second normally-off gate G2 of the second bidirectional power switch BDS_CS as a gated diode in response to an over voltage condition during unclamped inductive switching of the power semiconductor device 300. An over voltage condition occurs when the voltage VS2S1 across the main bidirectional power switch BDS exceeds the clamp voltage V_clamp determined by the second plurality of series-connected diodes D2_1 . . . D2_x.

The first plurality of series-connected diodes D1_1 . . . D1_x may include a first plurality of series-connected ESD protection diodes and the second plurality of series-connected diodes D2_1 . . . D2_x may include a second plurality of series-connected ESD protection diodes, for example. In the case of ESD protection diodes with a threshold or cut-in voltage of 3.3V, 80 to 140 diodes may be connected in series to yield a clamp voltage V_clamp in a range of 600V to 900V. More of less diodes may be used to set the clamp voltage V_clamp, and the number of series-connected diodes D1_1 . . . D1_x, D2_1 . . . D2_x depends on various factors including the diode technology, the breakdown voltage of the main bidirectional power switch BDS, etc.

In FIG. 5, the normally-on gate G_PD1 of the first normally-on pulldown switch PD is electrically connected to the first source/drain S1 of the main bidirectional power switch BDS. The first plurality of series-connected diodes D1_1 . . . D1_x is electrically connected between the second source/drain S2 of the main bidirectional power switch BDS and the drain D_PD1 of the first normally-on pulldown switch PD. The first voltage clamp device 204_1 is electrically connected between the source S_PD1 of the first normally-on pulldown switch PD1 and the first source/drain S1 of the main bidirectional power switch BDS. The normally-on gate G_PD2 of the second normally-on pulldown switch PD2 is electrically connected to the second source/drain S2 of the main bidirectional power switch BDS. The second plurality of series-connected diodes D2_1 . . . D2_x is electrically connected between the first source/drain S1 of the main bidirectional power switch BDS and the drain D_PD2 of the second normally-on pulldown switch PD2. The second voltage clamp device 204_2 is electrically connected between the source S_PD2 of the second normally-on pulldown switch PD and the second source/drain S2 of the main bidirectional power switch BDS. The first normally-off gate G1_OFF of the second bidirectional power switch BDS_CS is electrically connected to the drain D_PD1 of the first normally-on pulldown switch PD. The first source/drain S1_BDS_CS of the second bidirectional power switch BDS_CS is electrically connected to the source S_PD1 of the first normally-on pulldown switch PD1. The second normally-off gate G2_OFF of the second bidirectional power switch BDS_CS is electrically connected to the drain D_PD2 of the second normally-on pulldown switch PD2. The second source/drain S2_BDS_CS of the second bidirectional power switch BDS_CS is electrically connected to the source S_PD2 of the second normally-on pulldown switch PD2.

According to an embodiment, the first voltage clamp device 204_1 is a first Zener diode Z_D1 and the second voltage clamp device 204_2 is a second Zener diode Z_D2, e.g., as shown in FIG. 5. According to this embodiment, the cathode of the first Zener diode Z_D1 is electrically connected to the source S_PD1 of the first normally-on pulldown switch PD1 and the anode of the first Zener diode Z_D1 is electrically connected to the first source/drain S1 of the main bidirectional power switch BDS. Similarly, the cathode of the second Zener diode Z_D2 is electrically connected to the source S_PD2 of the second normally-on pulldown switch PD2 and the anode of the second Zener diode Z_D2 is electrically connected to the second source/drain S2 of the main bidirectional power switch BDS.

According to another embodiment, both voltage clamp devices 204_1, 204_2 are implemented as shown in FIG. 4. According to this embodiment, a first plurality of diodes Dd1_1 . . . DdN_1 is electrically connected between the drain of a first transistor Vd_SW1 and the gate of the first transistor first transistor Vd_SW1 and a first resistor Vd_GSR1 is electrically connected between the source of the first transistor Vd_SW1 and the gate of the first transistor first transistor Vd_SW1. Similarly, a second plurality of diodes Dd1_1 . . . DdN_2 is electrically connected between the drain of a second transistor Vd_SW2 and the gate of the second transistor Vd_SW2 and a second resistor Vd_GSR2 is electrically connected between the source of the second transistor Vd_SW2 and the gate of the second transistor Vd_SW2. The drain of the first transistor Vd_SW1 is electrically connected to the source S_PD1 of the first normally-on pulldown switch PD1 and the source of the first transistor Vd_SW1 is electrically connected to the first source/drain S1 of the main bidirectional power switch BDS. Similarly, the drain of the second transistor Vd_SW2 is electrically connected to the source S_PD2 of the second normally-on pulldown switch PD2 and the source of the second transistor Vd_SW2 is electrically connected to the second source/drain S2 of the main bidirectional power switch BDS.

The main bidirectional power switch BDS may be symmetrical or asymmetrical. A solid-state bidirectional switch has a first source/drain terminal S1, a second source/drain terminal S2, a compound semiconductor substrate 'Sub' such as, e.g., a GaN substrate, a common drift region in the compound semiconductor substrate and in series between the two source/drain terminals S1, S2, a first gate G1, and a second gate G2. In the case of a symmetrical bidirectional switch, both gates G1, G2 are normally-on or normally-off gates. In the case of an asymmetrical bidirectional switch, one gate is normally-on (i.e., depletion mode) and the other gate is normally-off gate (i.e., enhancement mode). For a normally-on gate, a current conduction channel is present adjacent the gate absent any voltage being applied to the gate. For a normally-off gate, a current conduction channel is not present adjacent the gate without a suitable voltage applied to the gate.

Accordingly, the first gate G1 and the second gate G2 of the main bidirectional power switch BDS may each be a normally-off gate. In another embodiment, the first gate G1 and the second gate G2 of the main bidirectional power switch BDS are each be a normally-on gate. In yet another embodiment, one of the first gate G1 and the second gate G2 of the main bidirectional power switch BDS is a normally-off gate and the other one of the first gate G1 and the second gate G2 of the main bidirectional power switch BDS is a normally-on gate.

Although the present disclosure is not so limited, the following numbered examples demonstrate one or more aspects of the disclosure.

Example 1. A power semiconductor device, comprising: a main power switch having a drain, a source, and a gate; and a voltage clamp circuit in parallel with the main power switch and having a clamp voltage less than a breakdown voltage of the main power switch, wherein the voltage clamp circuit comprises: a pulldown switch having a normally-on gate electrically connected to the source of the main power switch; a plurality of series-connected diodes electrically connected between the drain of the main power switch and a drain of the pulldown switch; a voltage clamp device electrically connected between a source of the pulldown switch and the source of the main power switch; and a second power switch having a normally-off gate electrically connected to the drain of the pulldown switch, a drain electrically connected to the drain of the main power switch, and a source electrically connected to the source of the pulldown switch.

Example 2. The power semiconductor device of example 1, wherein the main power switch is a first normally-off GaN transistor, wherein the pulldown switch is a normally-on GaN transistor, and wherein the second power switch is a second normally-off GaN transistor.

Example 3. The power semiconductor device of example 2, wherein the first normally-off GaN transistor, the normally-on GaN transistor and the second normally-off GaN transistor are monolithically integrated in the same GaN die.

Example 4. The power semiconductor device of example 2 or 3, wherein the first normally-off GaN transistor and the second normally-off GaN transistor have a same breakdown voltage, and wherein the second normally-off GaN transistor has a smaller area than the first normally-off GaN transistor.

Example 5. The power semiconductor device of any of examples 1 through 4, wherein the voltage clamp device is a Zener diode, wherein a cathode of the Zener diode is electrically connected to the source of the pulldown switch, and wherein an anode of the Zener diode is electrically connected to the source of the main power switch.

Example 6. The power semiconductor device of any of examples 1 through 5, wherein the voltage clamp device comprises: a transistor; a plurality of diodes electrically connected between a drain of the transistor and a gate of the transistor; and a resistor electrically connected between a source of the transistor and the gate of the transistor, wherein the drain of the transistor is electrically connected to the source of the pulldown switch, wherein the source of the transistor is electrically connected to the source of the main power switch.

Example 7. The power semiconductor device of any of examples 1 through 6, wherein the plurality of series-connected diodes comprises a plurality of series-connected ESD (electrostatic discharge) protection diodes.

Example 8. The power semiconductor device of any of examples 1 through 7, wherein the clamp voltage is in a range of 600V to 900V.

Example 9. The power semiconductor device of any of examples 1 through 8, wherein the voltage clamp circuit comprises a resistor electrically connected between the source and the drain of the pulldown switch.

Example 10. A power semiconductor device, comprising: a main bidirectional power switch having a first source/drain, a second source/drain, a first gate, and a second gate; and a voltage clamp circuit in parallel with the main bidirectional power switch and having a clamp voltage less than a breakdown voltage of the main bidirectional power switch, wherein the voltage clamp circuit comprises: a second bidirectional power switch having a first normally-off gate and a second normally-off gate; a first normally-on pulldown switch, a first plurality of series-connected diodes, and a first voltage clamp device collectively configured to turn on the first normally-off gate of the second bidirectional power switch in response to an over voltage condition during unclamped inductive switching of the power semiconductor device; and a second normally-on pulldown switch, a second plurality of series-connected diodes, and a second voltage clamp device collectively configured to turn on the second normally-off gate of the second bidirectional power switch in response to the over voltage condition.

Example 11. The power semiconductor device of example 10, wherein the first gate and the second gate of the main bidirectional power switch are each a normally-off gate.

Example 12. The power semiconductor device of example 10, wherein the first gate and the second gate of the main bidirectional power switch are each a normally-on gate.

Example 13. The power semiconductor device of example 10, wherein one of the first gate and the second gate of the main bidirectional power switch is a normally-off gate, and wherein the other one of the first gate and the second gate of the main bidirectional power switch is a normally-on gate.

Example 14. The power semiconductor device of any of examples 10 through 13, wherein: a normally-on gate of the first normally-on pulldown switch is electrically connected to the first source/drain of the main bidirectional power switch; the first plurality of series-connected diodes is electrically connected between the second source/drain of the main bidirectional power switch and a drain of the first normally-on pulldown switch; the first voltage clamp device is electrically connected between a source of the first normally-on pulldown switch and the first source/drain of the main bidirectional power switch; a normally-on gate of the second normally-on pulldown switch is electrically connected to the second source/drain of the main bidirectional power switch; the second plurality of series-connected diodes is electrically connected between the first source/drain of the main bidirectional power switch and a drain of the second normally-on pulldown switch; the second voltage clamp device is electrically connected between a source of the second normally-on pulldown switch and the second source/drain of the main bidirectional power switch; the first normally-off gate of the second bidirectional power switch is electrically connected to the drain of the first normally-on pulldown switch; a first source/drain of the second bidirectional power switch is electrically connected to the source of the first normally-on pulldown switch; the second normally-off gate of the second bidirectional power switch is electrically connected to the drain of the second normally-on pulldown switch; and a second source/drain of the second bidirectional power switch is electrically connected to the source of the second normally-on pulldown switch.

Example 15. The power semiconductor device of any of examples 10 through 14, wherein the first voltage clamp device is a first Zener diode, a cathode of the first Zener diode is electrically connected to a source of the first normally-on pulldown switch, and an anode of the first Zener diode is electrically connected to the first source/drain of the main bidirectional power switch, and wherein the second voltage clamp device is a second Zener diode, a cathode of the second Zener diode is electrically connected to a source of the second normally-on pulldown switch, and an anode of the second Zener diode is electrically connected to the second source/drain of the main bidirectional power switch.

Example 16. The power semiconductor device of any of examples 10 through 15, wherein the first voltage clamp device comprises: a first transistor; a first plurality of diodes electrically connected between a drain of the first transistor and a gate of the first transistor; and a first resistor electrically connected between a source of the first transistor and the gate of the first transistor, wherein the second voltage clamp device comprises: a second transistor; a second plurality of diodes electrically connected between a drain of the second transistor and a gate of the second transistor; and a second resistor electrically connected between a source of the second transistor and the gate of the second transistor, wherein the drain of the first transistor is electrically connected to a source of the first normally-on pulldown switch, wherein the source of the first transistor is electrically connected to the first source/drain of the main bidirectional power switch, wherein the drain of the second transistor is electrically connected to a source of the second normally-on pulldown switch, and wherein the source of the second transistor is electrically connected to the second source/drain of the main bidirectional power switch.

Example 17. The power semiconductor device of any of examples 10 through 16, wherein the first plurality of series-connected diodes comprises a first plurality of series-connected ESD (electrostatic discharge) protection diodes, and wherein the second plurality of series-connected diodes comprises at a second plurality of series-connected ESD protection diodes.

Example 18. The power semiconductor device of any of examples 10 through 17, wherein the clamp voltage is in a range of 600V to 900V.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended

What is claimed is:

1. A power semiconductor device, comprising:
a main power switch having a drain, a source, and a gate; and
a voltage clamp circuit in parallel with the main power switch and having a clamp voltage less than a breakdown voltage of the main power switch,
wherein the voltage clamp circuit comprises:
a pulldown switch having a normally-on gate electrically connected to the source of the main power switch;
a plurality of series-connected diodes electrically connected between the drain of the main power switch and a drain of the pulldown switch;
a voltage clamp device electrically connected between a source of the pulldown switch and the source of the main power switch; and
a second power switch having a normally-off gate electrically connected to the drain of the pulldown switch, a drain electrically connected to the drain of the main power switch, and a source electrically connected to the source of the pulldown switch.

2. The power semiconductor device of claim 1, wherein the main power switch is a first normally-off GaN transistor, wherein the pulldown switch is a normally-on GaN transistor, and wherein the second power switch is a second normally-off GaN transistor.

3. The power semiconductor device of claim 2, wherein the first normally-off GaN transistor, the normally-on GaN transistor and the second normally-off GaN transistor are monolithically integrated in the same GaN die.

4. The power semiconductor device of claim 2, wherein the first normally-off GaN transistor and the second normally-off GaN transistor have a same breakdown voltage, and wherein the second normally-off GaN transistor has a smaller area than the first normally-off GaN transistor.

5. The power semiconductor device of claim 1, wherein the voltage clamp device is a Zener diode, wherein a cathode of the Zener diode is electrically connected to the source of the pulldown switch, and wherein an anode of the Zener diode is electrically connected to the source of the main power switch.

6. The power semiconductor device of claim 1, wherein the voltage clamp device comprises:
a transistor;
a plurality of diodes electrically connected between a drain of the transistor and a gate of the transistor; and
a resistor electrically connected between a source of the transistor and the gate of the transistor,
wherein the drain of the transistor is electrically connected to the source of the pulldown switch,
wherein the source of the transistor is electrically connected to the source of the main power switch.

7. The power semiconductor device of claim 1, wherein the plurality of series-connected diodes comprises a plurality of series-connected ESD (electrostatic discharge) protection diodes.

8. The power semiconductor device of claim 1, wherein the clamp voltage is in a range of 600V to 900V.

9. The power semiconductor device of claim 1, wherein the voltage clamp circuit comprises a resistor electrically connected between the source and the drain of the pulldown switch.

10. A power semiconductor device, comprising:
a main bidirectional power switch having a first source/drain, a second source/drain, a first gate, and a second gate; and
a voltage clamp circuit in parallel with the main bidirectional power switch and having a clamp voltage less than a breakdown voltage of the main bidirectional power switch,
wherein the voltage clamp circuit comprises:
a second bidirectional power switch having a first normally-off gate and a second normally-off gate;
a first normally-on pulldown switch, a first plurality of series-connected diodes, and a first voltage clamp device collectively configured to turn on the first normally-off gate of the second bidirectional power switch in response to an over voltage condition during unclamped inductive switching of the power semiconductor device; and
a second normally-on pulldown switch, a second plurality of series-connected diodes, and a second voltage clamp device collectively configured to turn on the second normally-off gate of the second bidirectional power switch in response to the over voltage condition.

11. The power semiconductor device of claim 10, wherein the first gate and the second gate of the main bidirectional power switch are each a normally-off gate.

12. The power semiconductor device of claim 10, wherein the first gate and the second gate of the main bidirectional power switch are each a normally-on gate.

13. The power semiconductor device of claim 10, wherein one of the first gate and the second gate of the main bidirectional power switch is a normally-off gate, and wherein the other one of the first gate and the second gate of the main bidirectional power switch is a normally-on gate.

14. The power semiconductor device of claim 10, wherein:
a normally-on gate of the first normally-on pulldown switch is electrically connected to the first source/drain of the main bidirectional power switch;
the first plurality of series-connected diodes is electrically connected between the second source/drain of the main bidirectional power switch and a drain of the first normally-on pulldown switch;
the first voltage clamp device is electrically connected between a source of the first normally-on pulldown switch and the first source/drain of the main bidirectional power switch;
a normally-on gate of the second normally-on pulldown switch is electrically connected to the second source/drain of the main bidirectional power switch;
the second plurality of series-connected diodes is electrically connected between the first source/drain of the main bidirectional power switch and a drain of the second normally-on pulldown switch;
the second voltage clamp device is electrically connected between a source of the second normally-on pulldown switch and the second source/drain of the main bidirectional power switch;
the first normally-off gate of the second bidirectional power switch is electrically connected to the drain of the first normally-on pulldown switch;
a first source/drain of the second bidirectional power switch is electrically connected to the source of the first normally-on pulldown switch;
the second normally-off gate of the second bidirectional power switch is electrically connected to the drain of the second normally-on pulldown switch; and
a second source/drain of the second bidirectional power switch is electrically connected to the source of the second normally-on pulldown switch.

15. The power semiconductor device of claim 10, wherein the first voltage clamp device is a first Zener diode, a cathode of the first Zener diode is electrically connected to a source of the first normally-on pulldown switch, and an anode of the first Zener diode is electrically connected to the first source/drain of the main bidirectional power switch, and wherein the second voltage clamp device is a second Zener diode, a cathode of the second Zener diode is electrically connected to a source of the second normally-on pulldown switch, and an anode of the second Zener diode is electrically connected to the second source/drain of the main bidirectional power switch.

16. The power semiconductor device of claim 10,
wherein the first voltage clamp device comprises:
a first transistor;
a first plurality of diodes electrically connected between a drain of the first transistor and a gate of the first transistor; and
a first resistor electrically connected between a source of the first transistor and the gate of the first transistor,
wherein the second voltage clamp device comprises:
a second transistor;
a second plurality of diodes electrically connected between a drain of the second transistor and a gate of the second transistor; and
a second resistor electrically connected between a source of the second transistor and the gate of the second transistor,
wherein the drain of the first transistor is electrically connected to a source of the first normally-on pulldown switch,
wherein the source of the first transistor is electrically connected to the first source/drain of the main bidirectional power switch,
wherein the drain of the second transistor is electrically connected to a source of the second normally-on pulldown switch, and
wherein the source of the second transistor is electrically connected to the second source/drain of the main bidirectional power switch.

17. The power semiconductor device of claim 10, wherein the first plurality of series-connected diodes comprises a first plurality of series-connected ESD (electrostatic discharge) protection diodes, and wherein the second plurality of series-connected diodes comprises at a second plurality of series-connected ESD protection diodes.

18. The power semiconductor device of claim 10, wherein the clamp voltage is in a range of 600V to 900V.

* * * * *